United States Patent
Sano

(10) Patent No.: US 12,219,832 B2
(45) Date of Patent: Feb. 4, 2025

(54) FLEXIBLE SUBSTRATE WITH IMPROVED PERFORMANCE UNDER BENDING STRESS

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 498 days.

(21) Appl. No.: 17/656,891

(22) Filed: Mar. 29, 2022

(65) Prior Publication Data

US 2022/0320252 A1 Oct. 6, 2022

(30) Foreign Application Priority Data

Apr. 2, 2021 (JP) ................................. 2021-063650

(51) Int. Cl.
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02)

(58) Field of Classification Search
CPC .................................................. H10K 59/131
USPC ......................................................... 257/40
See application file for complete search history.

(56) References Cited

U.S. PATENT DOCUMENTS

| | | | |
|---|---|---|---|
| 2015/0282294 A1 | 10/2015 | Wakuda et al. | |
| 2015/0282296 A1 | 10/2015 | Ogura et al. | |
| 2017/0003440 A1* | 1/2017 | Kim | H05K 1/0283 |
| 2017/0181276 A1 | 6/2017 | Sawada et al. | |
| 2018/0114825 A1* | 4/2018 | Hong | H10K 59/121 |
| 2020/0296826 A1* | 9/2020 | Tomita | H05K 1/0283 |

FOREIGN PATENT DOCUMENTS

| | | |
|---|---|---|
| JP | 2015-198101 A | 11/2015 |
| JP | 2015-198102 A | 11/2015 |
| JP | 2017-113088 A | 6/2017 |
| JP | 2017-118109 A | 6/2017 |

* cited by examiner

*Primary Examiner* — Ajay Arora
(74) *Attorney, Agent, or Firm* — Maier & Maier, PLLC

(57) ABSTRACT

According to one embodiment, a flexible substrate includes an insulating base including first and second strip portions, and island-shaped portions, electrical elements, scanning lines each extending while overlapping the first strip portions, signal lines each extending while overlapping the second strip portions, connection wiring lines each extending while overlapping the second strip portions, a scanning line driver, a signal line driver, a support body including a first side edge, and scanning lines are connected to different connection wiring lines on different island-shaped portion, and the scanning line driver and the signal line driver are located on a side of the first side edge.

5 Claims, 8 Drawing Sheets

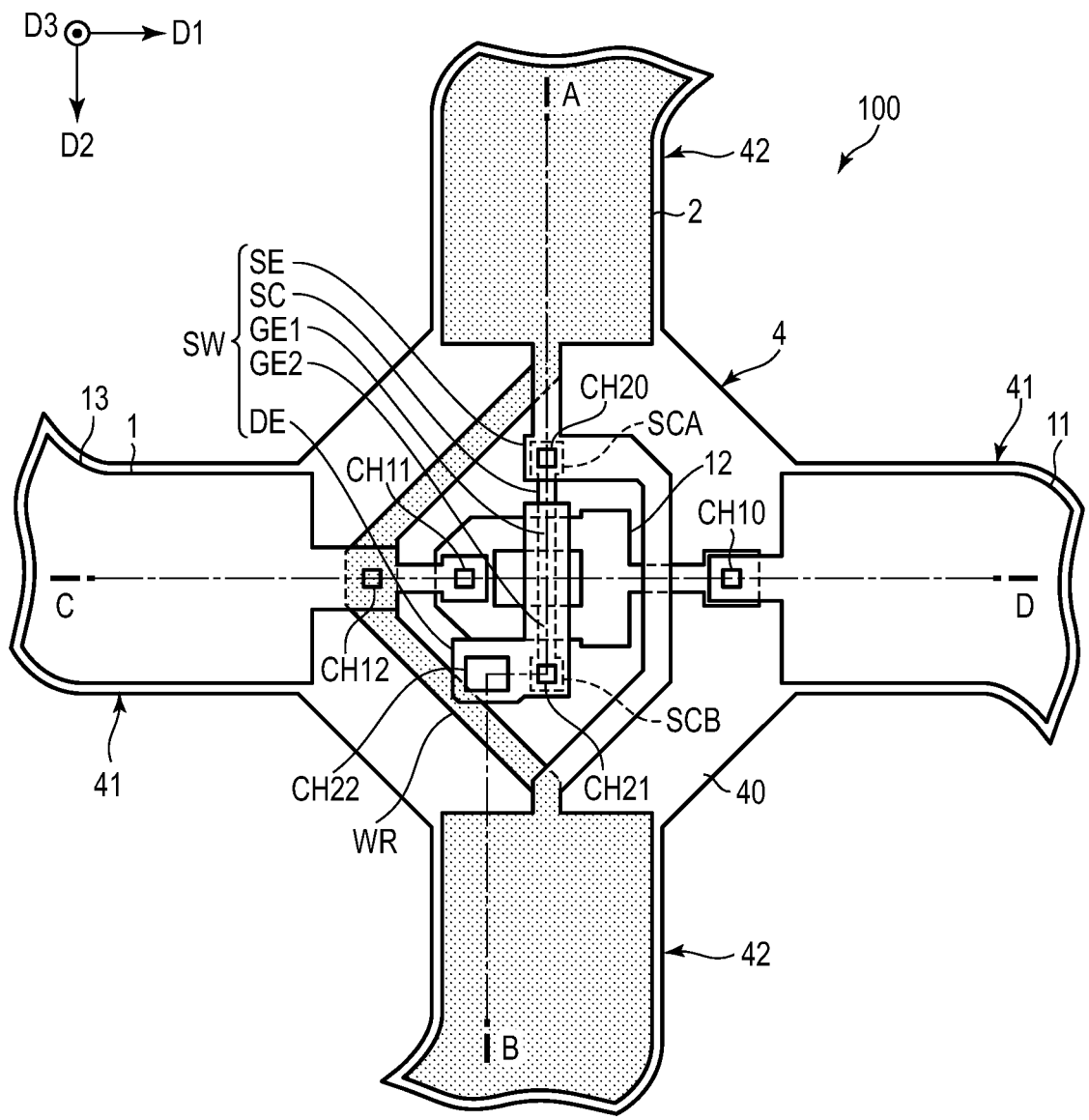
F I G. 4

FLEXIBLE SUBSTRATE WITH IMPROVED PERFORMANCE UNDER BENDING STRESS

CROSS-REFERENCE TO RELATED APPLICATIONS

This application is based upon and claims the benefit of priority from Japanese Patent Application No. 2021-063650, filed Apr. 2, 2021, the entire contents of which are incorporated herein by reference.

FIELD

Embodiments described herein relate generally to a flexible substrate.

BACKGROUND

In recent years, the use of flexible substrates having flexibility and elasticity has been studied in various fields. As an example of such use, a flexible substrate on which electrical elements arranged in a matrix shape can be attached to a curved surface such as a housing of an electronic device or a human body. As the electrical elements, for example, various sensors such as touch sensors and temperature sensors, and display elements can be applied.

In the flexible substrates, it is necessary to take measures to prevent the wiring portions from being damaged by stress caused by bending and stretching. As such measures, for example, it has been proposed that honeycomb-shaped openings be provided in the substrate which supports the wiring portion, and that the wiring portion are formed into a meandering shape.

BRIEF DESCRIPTION OF THE DRAWINGS

FIG. 4 is another enlarged plan view of an island-shaped portion shown in FIG. 2.

DETAILED DESCRIPTION

Figure 1:
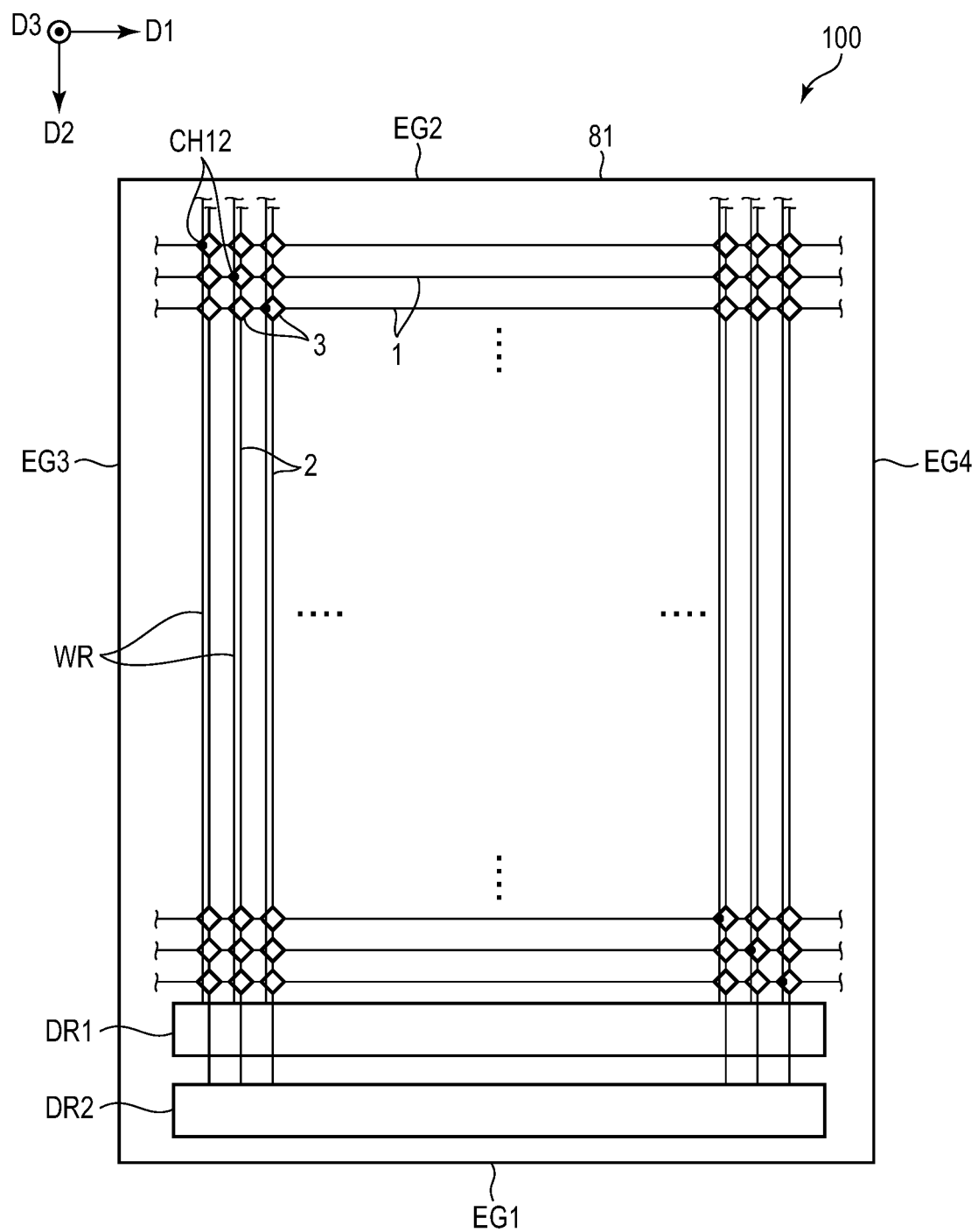
FIG. 1 is a plan view schematically showing a flexible substrate according to this embodiment.

In general, according to one embodiment, a flexible substrate comprises an insulating base including a plurality of first strip portions extending along a first direction and aligned along a second direction intersecting the first direction, and a plurality of second strip portions extending along the second direction and aligned along the first direction and a plurality of island-shaped portions located at respective intersections of the first strip portions and the second strip portions, a plurality of electrical elements overlapping the island-shaped portions, respectively, a plurality of scanning lines each extending while overlapping the respective first strip portion, a plurality of signal lines each extending while overlapping the respective second strip portion, a plurality of connection wiring lines each extending while overlapping the respective second strip portion and the respective signal line, a scanning line driver to which the connection wiring lines are connected, a signal line driver to which the signal lines are connected, a support body supporting the insulating base, the scanning line driver and the signal line driver and including a first side edge, and multiple scanning lines are connected to different connection wiring lines on different island-shaped portion, respectively, and the scanning line driver and the signal line driver are located on a side of the first side edge.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

FIG. 1 is a perspective view schematically showing a configuration of a flexible substrate 100 of the present embodiment.

In this embodiment, a first direction D1, a second direction D2 and a third direction D3 are defined as shown in the figure. The first direction D1 and the second direction D2 are parallel to the main surface of the flexible substrate 100 and intersect each other. The third direction D3 is perpendicular to the first direction D1 and the second direction D2, and corresponds to the thickness direction of the flexible substrate 100. In this embodiment, the first direction D1 and the second direction D2 intersect at right angles, but they may intersect at an angle other than right angles. In this document, the direction toward the tip of the arrow indicating the third direction D3 is referred to as "up" and the direction from the tip of the arrow to the opposite direction is referred to as "down". Further, when it is assumed that there is an observation position to observe the flexible substrate 100 on a side of the tip of the arrow indicating the third direction D3, viewing from this observation position toward a D1-D2 plane defined by the first direction D1 and the second direction D2 is referred to as a planar view.

As shown in FIG. 1, the flexible substrate 100 comprises a plurality of scanning lines 1, a plurality of signal lines 2, a plurality of connection wiring lines WR, a plurality of electrical elements 3, a resin layer (support) 81, a scanning line driver DR1, a signal line driver DR2.

The scanning lines 1, the signal lines 2, the connection wiring lines WR, the electrical elements 3, the scanning line driver DR1 and the signal line driver DR2 are provided on the resin layer 81. In other words, the resin layer 81 supports an insulating substrate 4, which will be described later, the scanning line driver DR1 and the signal line driver DR2. In the example illustrated, the resin layer 81 is formed into a rectangular shape in plan view. The resin layer 81 includes a first side edge EG1 and a second side edge EG2, extending along the first direction D1, and a third side edge EG3 and a fourth side edge EG4, extending along the second direction D2.

The scanning line driver DR1 and the signal line driver DR2 are located on a first side edge EG1 side. The signal line driver DR2 is located between the scanning line driver DR1 and the first side edge EG1.

The scanning lines 1 each extend along the first direction D1 and are aligned along the second direction D2. The scanning lines 1 are connected to respective connection wiring lines WR at positions which overlap respective electrical elements 3. The scanning lines are connected to the connection wiring lines WR via contact holes CH12, respectively.

The connection wiring lines WR each extend along the second direction D2 and are aligned along the first direction D1. The connection wiring lines WR are each connected to the scanning line driver DR1. For example, the number of connection wiring lines WR is equal to the number of scanning lines 1.

The signal lines 2 each extend along the second direction D2 and are aligned along the first direction D1. The signal lines 2 are each connected to the signal line driver DR2. A plurality of signal lines 2 pass through the area where the scanning line driver DR1 is located.

The electrical elements 3 are arranged in a matrix along the first direction D1 and the second direction D2. The electrical elements 3 are located at intersections of the scanning lines 1 and the signal lines 2, respectively, and are electrically connected to the scanning lines 1 and the signal lines 2.

For example, let us focus on the mth (m is a positive integer) scanning line 1 from a second side edge EG2 side, and the nth (n is a positive integer) connection wiring line WR from a third side edge EG3 side. The mth scanning line 1 is connected to the nth connecting wiring lines WR, and m and n are equal to each other. Further, the scanning line 1 is connected to the connection wiring line at the position which overlaps with the electric element 3 located at the mth row and nth column. The connection position between the scanning line 1 and the connection wiring line WR is not limited to that of this example.

A scanning signal is supplied to the electrical element 3 via the connection wiring line WR and the respective scanning line 1. When the electric element 3 is, for example, of a type such as a sensor, which outputs signals, the signal line 2 receives the output signal from the electric element 3. Note that the scanning lines 1, the signal lines 2 and the connection wiring lines WR are an example of the wiring lines of the flexible substrate 100. In addition to the scanning lines 1, the signal lines 2 and the connection wiring lines WR, the flexible substrate 100 may comprise other types of wiring lines including a power supply line that supplies power to the electric elements 3.

The scanning line driver DR1 functions as a supply source that supplies scanning signals to each of the scanning lines 1 via the respective connection wiring line WR. The signal line driver DR2 functions as a supply source that supplies drive signals to each of the signal lines 2, or as a signal processing unit that processes the output signals output to each of the signal lines 2.

According to this embodiment, the scanning line driver DR1 and the signal line driver DR2 are located on the same first side edge EG1 side. Although they may interfere with the expansion and contraction of the flexible substrate 10, the scanning line driver DR1 and the signal line driver DR2 are located on the same first side edge EG1. With this configuration, it is possible to prevent them from interfering with the expansion and contraction of vicinities of the second side edge EG2, the third side edge EG3 and the fourth side edge EG4. That is, the elasticity of the flexible substrate 100 can be improved as compared to the case where the scanning line driver DR1 and the signal line driver DR2 are placed on different side edges.

Figure 2:
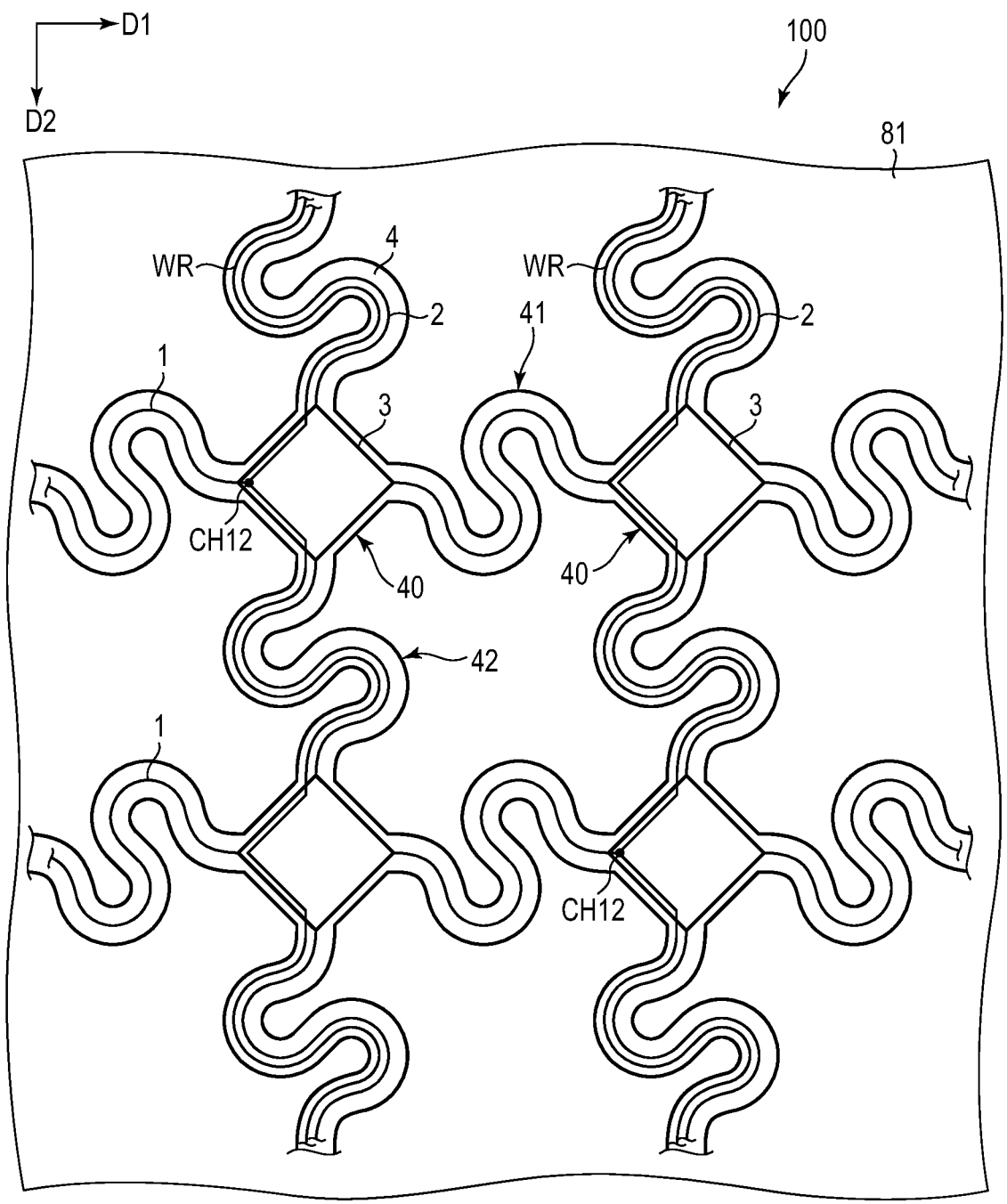
FIG. 2 is a partially enlarged plan view of the flexible substrate shown in FIG. 1.

FIG. 2 shows a partially enlarged plan view of the flexible substrate 100 shown in FIG. 1.

As shown in FIG. 2, the flexible substrate 100 comprises, in addition to those mentioned above, an insulating base 4 that supports the scanning lines 1, the signal lines 2 and the connection wiring lines WR. The insulating base 4 has elasticity and flexibility. The insulating base 4 is formed of, for example, polyimide, but the material is not limited to this.

The insulating base 4 comprises a plurality of island-shaped portions 40 and strip portions 41 and 42 formed to be integrated with each island-shaped portion 40. The insulating base 4 is formed into a mesh fashion. The island-shaped portions 40 are arranged in a matrix along the first direction D1 and the second direction D2 so as to be spaced from each other. Each of the island-shaped portions 40 is formed into, for example, a rectangular shape in plan view. Note that the island-shaped portions 40 may be formed in other polygonal shapes or circular or elliptical shapes. The electrical elements 3 are superimposed respectively on the island-shaped portions 40.

The strip portions 41 each extend substantially along the first direction D1 and are aligned along the second direction D2. The strip portions 41 connect those island-shaped portions 40 which are aligned along the first direction D1, to each other. The strip portions 42 extends substantially along the second direction D2 and are aligned along the first direction D1. The strip portions 42 connect those island-shaped portions 40 which are aligned along the second direction D2, to each other. The strip portions 41 and 42 are each formed in a wavy shape in plan view. In other words, the strip portions 41 and 42 are formed in a meandering shape in plan view. The island-shaped portions 40 are located at the intersections of the respective first strip portions 41 and the respective second strip portions 42.

The scanning lines 1 extend while overlapping the strip portions 41, respectively. The signal lines 2 extend while overlapping the strip portions 42, respectively. That is, the scanning lines 1 and the signal lines 2 are all formed into a meandering shape. The connection wiring lines WR extend while overlapping the second strip portions 42 and the signal lines 2, respectively. In other words, the scanning lines 1, the signal lines 2 and the connection wiring lines WR are all formed in a meandering pattern. A plurality of scanning lines 1 are connected to respective connection wiring lines WR on respective island-shaped portions 40.

Figure 3:
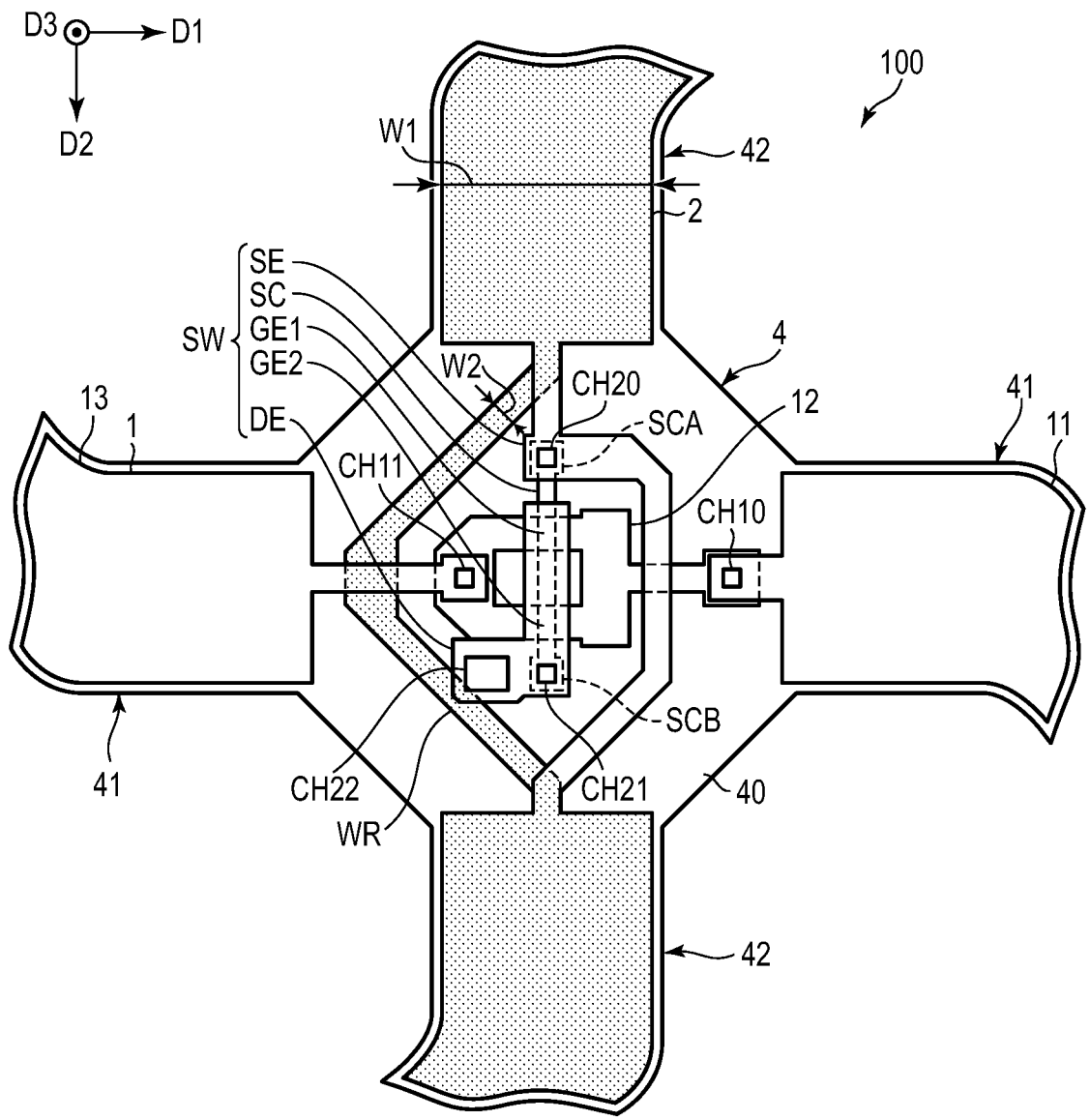
FIG. 3 is an enlarged plan view of an island-shaped portion shown in FIG. 2.

FIG. 3 is an enlarged plan view of the island-shaped portion 40 shown in FIG. 2. FIG. 3 shows the island-shaped portion 40 at a position where a scanning line 1 and a connection wiring line WR are not connected to each other. In FIG. 3, the electrical element 3 is omitted from the illustration.

The connection wiring line WR is located in the area indicated by dots in the figure. The connection wiring line WR has a first width W1 at the position overlapping the second strip portion 42, and a second width W2 at the position overlapping the island-shaped portion 40. The first width W1 is greater than the second width W2.

The scanning line 1 includes a first portion 11, a second portion 12, and a third portion 13. The first portion 11 and the third portion 13 overlap the first strip portion 4. The first portion 11 and the third portion 13 are formed in the same layer as that of the signal line 2. The third portion 13 intersects the connection wiring line WR. The second portion 12 is located between the first portion 11 and the third portion 13 in plan view, and overlaps the island-shaped portion 40. The second portion 12 is formed in a different layer from that of the signal line 2. The second portion 12 is located between the connection wiring line WR and the signal line 2 in plan view in the position overlapping the island-shaped portion 40, and partially intersects the signal line 2. The first portion 11 and the second portion 12 are connected to each other via a contact hole (first contact hole) CH10, and the second portion 12 and the third portion are connected to each other via a contact hole (second contact hole) CH11.

The flexible substrate 100 comprises switching elements SW. The switching elements SW each include a semiconductor layer SC, gate electrodes GE1 and GE2, a source electrode SE, and a drain electrode DE. The semiconductor layer SC extends in the second direction D2. One end portion SCA of the semiconductor layer SC overlaps the signal line 2, and the other end portion SCB of the semiconductor layer SC overlaps the drain electrode DE. The region of the signal line 2, which overlaps the semiconductor layer SC, functions as the source electrode SE. The semiconductor layer SC intersects with the second portion 11 of the scanning line 1 at two locations in the position where it overlaps the drain electrode DE. The regions of the scanning line 1, which overlap the semiconductor layer SC, function as the gate electrodes GE1 and GE2, respectively. That is, the switching elements SW in the example shown in the figure have a double-gate structure. The semiconductor layer SC is connected to the signal line 2 in the one end portion SCA via a contact hole CH20, and is electrically connected to the drain electrode DE via a contact hole CH21 in the other end portion SCB. The drain electrode DE is connected to the lower electrode EL1, which will be described later, via a contact hole CH22.

FIG. 4 is an enlarged plan view of an island-shaped portion 40 shown in FIG. 2. FIG. 4 shows the island-shaped portion 40 at the position where the scanning line 1 and the connection wiring line WR are connected to each other. Further, in FIG. 4, the electrical element 3 is omitted from illustration. The configuration shown in FIG. 4, other than the connection between the scanning line 1 and the connection wiring line WR, is the same as the configuration shown in FIG. 3.

The connection wiring line WR is connected to the third portion 40 extending to the island-shaped portion 40 via a contact hole (third contact hole) CH12. The contact hole CH12, the contact hole CH11 and the contact hole CH10 are aligned along the first direction D1 in this order.

Figure 5:
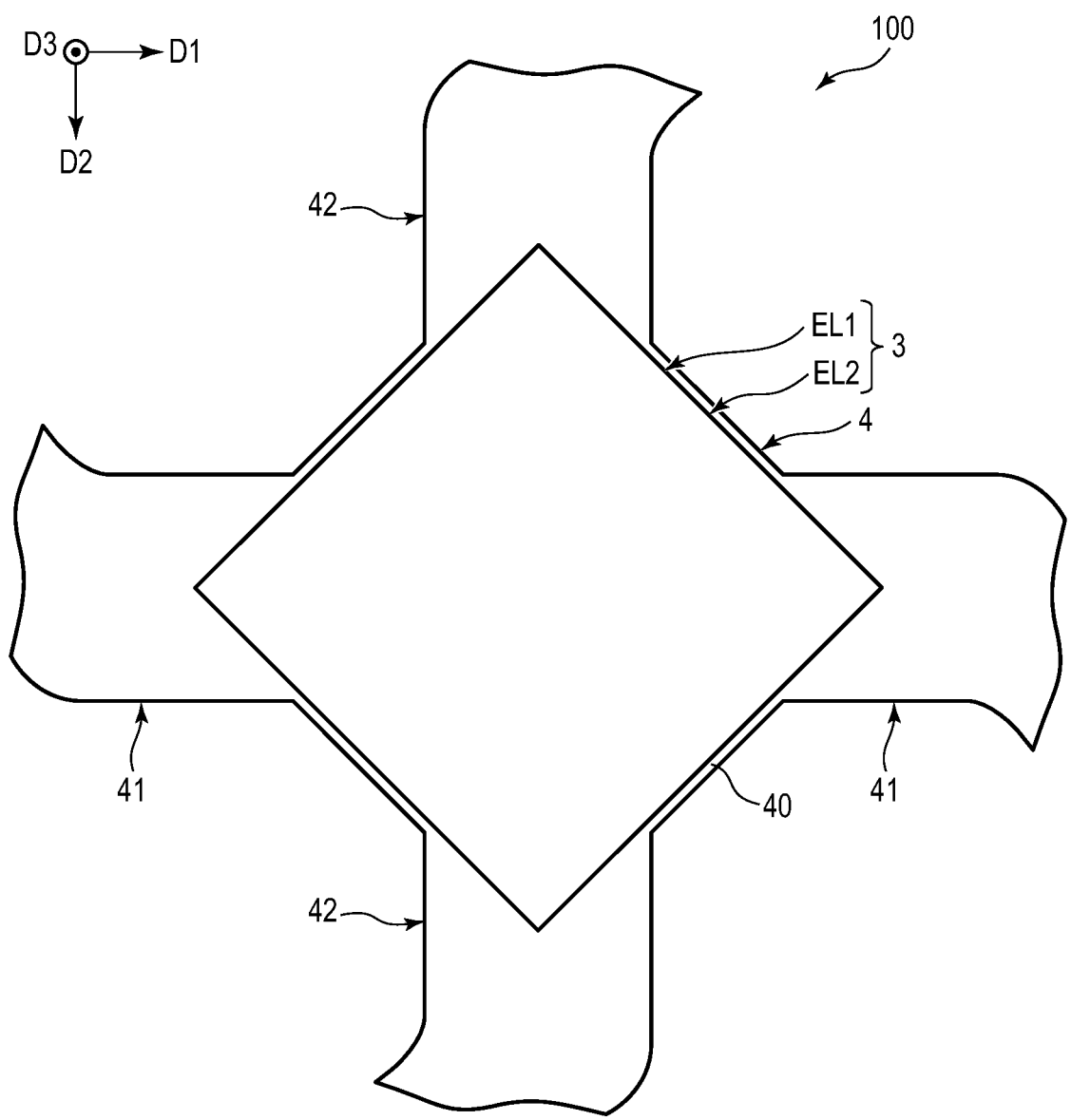
FIG. 5 is a plan view of an electrical element omitted from the illustrations in FIGS. 3 and 4.

FIG. 5 is a plan view of an electrical element 3, which is omitted from the illustrations in FIGS. 3 and 4.

The electrical element 3 includes a lower electrode EL1, an upper electrode EL2 located above the lower electrode EL1, and an active layer 30, which will be described later. The lower electrode EL1 and the upper electrode EL2 are formed identical in shape. In the example illustrated, the lower electrode EL1 and the upper electrode EL2 are formed into a rectangular shape on the island-shaped portion 40.

Figure 6:
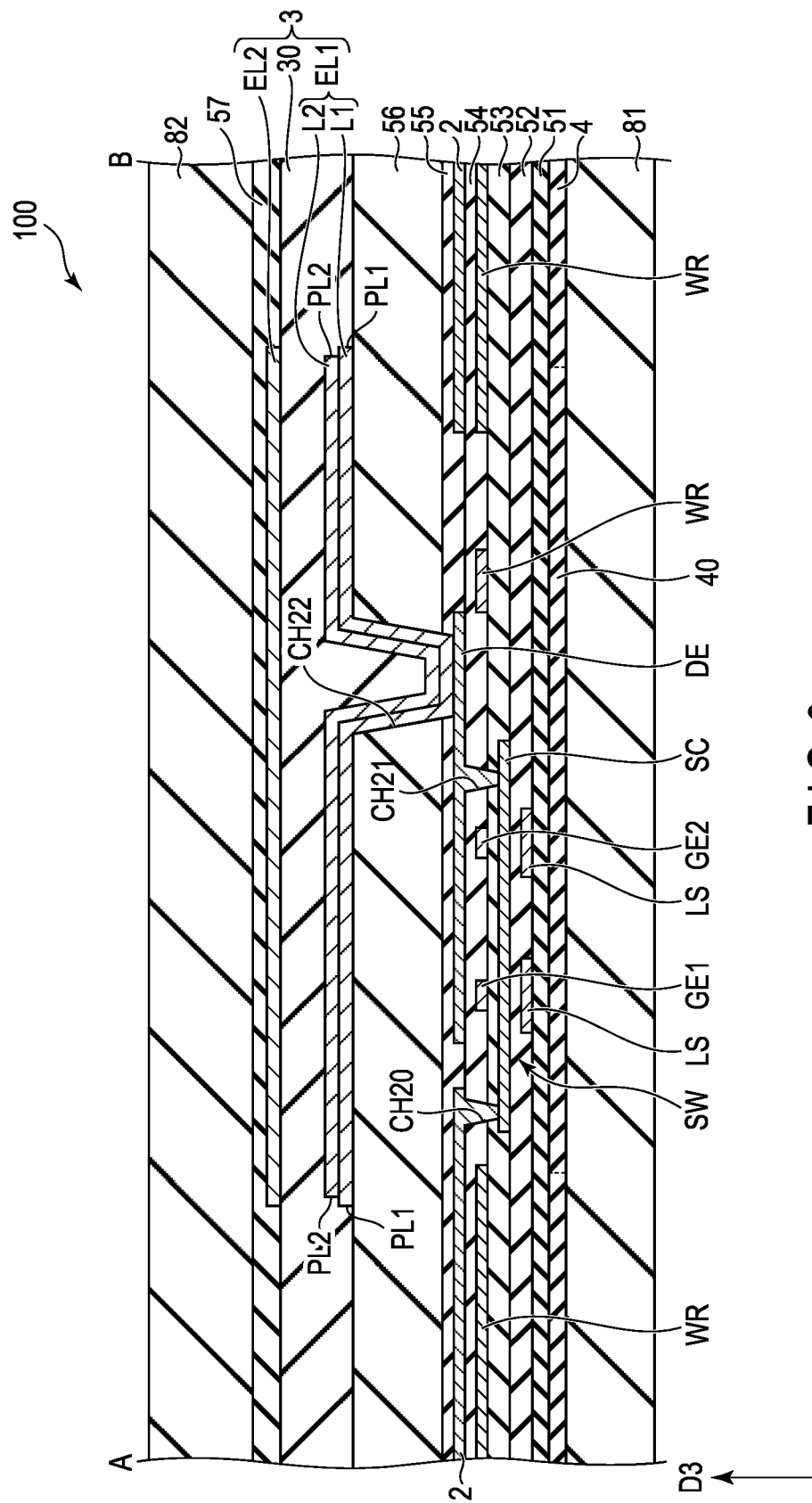
FIG. 6 is a cross-sectional view of the flexible substrate taken along line A-B shown in FIG. 4.

FIG. 6 is a cross-sectional view of the flexible substrate 100 taken along line A-B shown in FIG. 4.

As shown in FIG. 6, the flexible substrate 100 further comprises insulating layers 51 to 56, a sealing layer 57, light-shielding layers LS and a resin layer 82.

The insulating base 4 is located on the resin layer 81. The insulating layer 51 is located on the insulating base 4. The light-shielding layers LS are located on the insulating layer 51. The light-shielding layers LS overlaps the gate electrodes GE1 and GE2, respectively. With this configuration, the light-shielding layers LS can shield the light from a lower side toward the gate electrodes GE1 and GE2. The light-shielding layer LS is made of, for example, a metal material such as aluminum (Al), titanium (Ti), silver (Ag), molybdenum (Mo), tungsten (W), copper (Cu) or chromium (Cr).

The insulating layer 52 is located on the insulating layer 51 to cover the light-shielding layer LS. The semiconductor layer SC is located on the insulating layer 52. The semiconductor layer SC is formed, for example, of a polycrystalline silicon (for example, a low-temperature polysilicon), but may as well be formed of an amorphous silicon or oxide semiconductor. The insulating layer 53 is located on the insulating layer 52 to cover the semiconductor layer SC. The contact wiring lines WR, and the gate electrodes GE1 and GE2 are located on the insulating layer 53. The insulating layer 54 is located on the insulating layer 53 to cover the contact wiring lines WR, and the gate electrodes GE1 and GE2.

The signal lines 2 and the drain electrode DE are located on the insulating layer 54. The signal lines 2 are connected to the semiconductor layer SC via the contact hole CH20 formed in the insulating layers 53 and 54. The signal lines 2 can be formed, for example, of a metal material or a transparent conductive material, and may be of a single-layer or stacked-layered structure. The drain electrode DE is connected to the semiconductor layer SC via the contact hole CH21 formed in the insulating layers 53 and 54. The drain electrode DE is formed, for example, of the same material as that of the signal lines 2. The drain electrode DE covers the gate electrodes GE1 and GE2. With this configuration, the drain electrode DE can shield the light from an upper side towards the gate electrodes GE1 and GE2. The insulating layer 55 is located on the insulating layer 54 to cover the signal lines 2 and the drain electrode DE. The insulating layer 56 is located on the insulating layer 55. The insulating layers 51 to 56 are stacked in this order.

The switching element SW is located between the island-shaped portion 40 of the insulating base 4 and the lower electrode EL1. The switching element SW illustrated here is of a double-gate structure, but it may as well be of a single-gate structure. Further, the switching element SW is of a top gate structure in which the gate electrodes GE1 and GE2 are disposed above the semiconductor layer SC, but may as well be of a single gate structure in which the gate electrodes GE1 and GE2 are disposed below the semiconductor layer SC.

The insulating layers 51 to 55 are all inorganic insulating layers formed of an inorganic insulating material such as silicon oxide (SiO), silicon nitride (SiN), silicon oxynitride (SiON) or the like. The insulating layer 56 is an organic insulating layer formed of an organic insulating material such as acrylic resin. The upper surface of the insulating layer 56 is substantially planarized.

The electrical element 3 is located on the insulating layer 56. The electrical element 3 is, for example, an organic photodetector (organic photo diode (OPD)). As described above, the electric element 3 comprises a lower electrode EL1, an active layer 30 and an upper electrode EL2.

The lower electrode EL1 is located on the insulating layer 56. The lower electrode EL1 comprises a first layer L1 and a second layer L2 stacked one on another. The first layer L1 is connected to the drain electrode DE via the contact hole CH22 formed in the insulating layers 55 and 56. That is, the first layer L1 is in contact with the switching element SW. The first layer L1 and the second layer L2 are transparent electrodes formed of a transparent conductive material such as indium tin oxide (ITO) or indium zinc oxide (IZO). The first layer L1 includes an outer periphery PL1. The second layer L2 includes an outer periphery PL2. The outer periphery PL2 is located on an inner side of the outer periphery PL1.

The active layer 30 is located on the lower electrode EL1. The active layer 30 is made from an electron donor (p-type semiconductor) and an electron acceptor (n-type semiconductor), formed of an organic material.

The upper electrode EL2 is located on the active layer 30. In other words, the active layer 30 is located between the lower electrode EL1 and the upper electrode EL2. The upper electrode EL2 is a transparent electrode formed of a transparent conductive material such as ITO or IZO. The upper electrode EL2 is connected to a power supply line (not shown), and a common potential, for example, is supplied thereto. Note that, although not shown in the figure, an electron transport layer is formed between the lower electrode EL1 and the active layer 30, and a hole transport layer is formed between the upper electrode EL2 and the active layer 30.

The active layer 30, when it receives light, generates hole and electron pairs. The hole and electron pairs generated by the active layer 30 generate an electric current, and the electric signal corresponding to the intensity of the current is read out via the respective signal line 2.

The sealing layer 57 covers the upper electrode EL2. The sealing layer 57 inhibits moisture from entering the active layer 30 from outside. The resin layer 82 covers the sealing layer 57.

Figure 7:
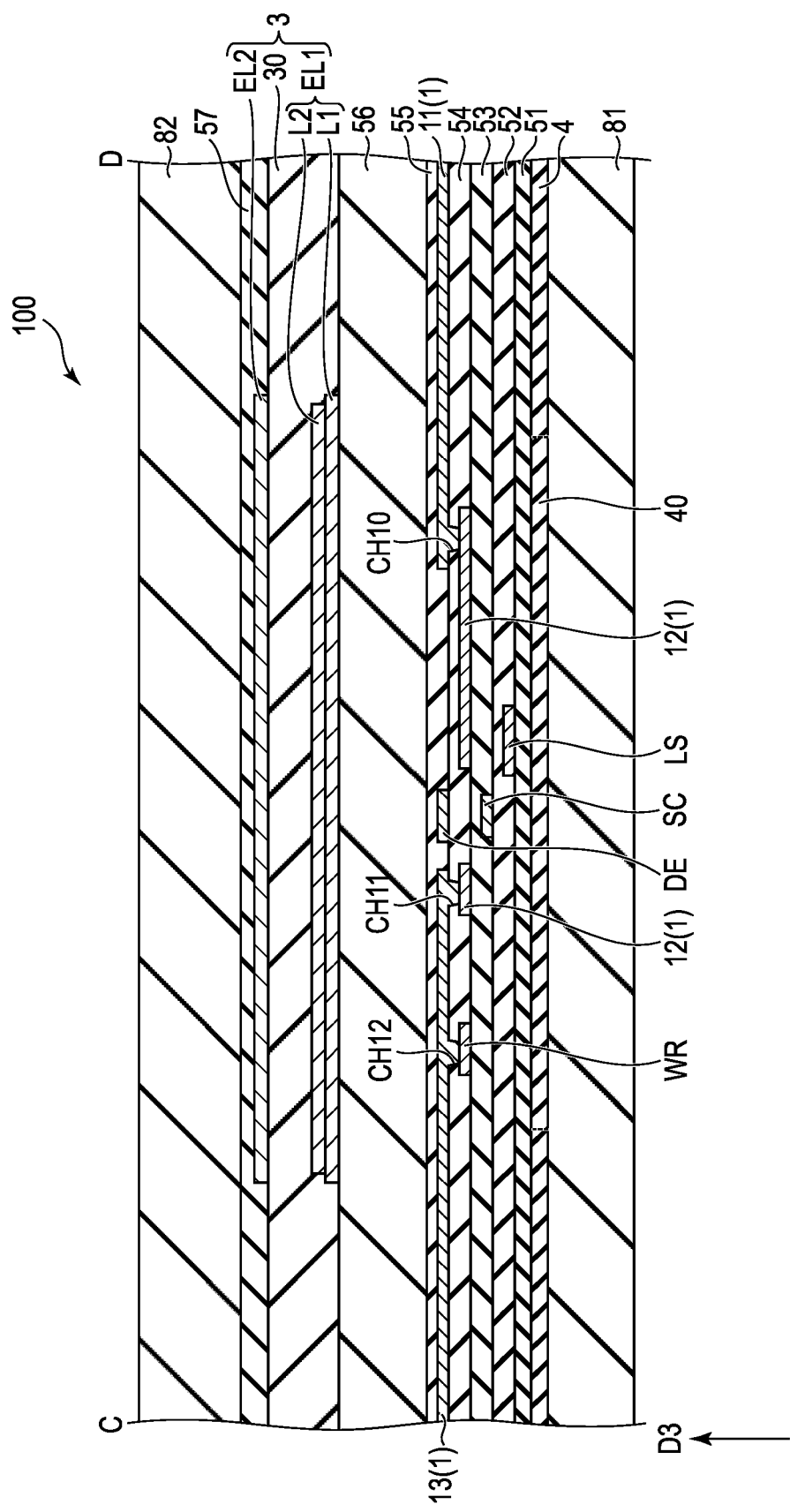
FIG. 7 is a cross-sectional view of the flexible substrate taken along line C-D shown in FIG. 4.

FIG. 7 is a cross-sectional view of the flexible substrate 100 taken along line C-D shown in FIG. 4.

The connection wiring line WR and the second portion 12 of the scanning line 1 are located on the insulating layer 53 and covered by the insulating layer 54. In other words, the connection wiring line WR and the second portion 12 are located between the insulating layer 53 (the first insulating layer) and the insulating layer 54 (the second insulating layer).

The first portion 11 and the third portion 13 of the scanning line 1 and the drain electrode DE are located on the insulating layer 54 and covered by the insulating layer 55. The first portion 11 is connected to the second portion 12 via the contact hole CH10 formed in the insulating layer 54. The third portion 13 is connected to the second portion 12 via the contact hole CH11 formed in the insulating layer 54. Further, the third portion 13 is connected to the connection wiring line WR via the contact hole CH12 formed in the insulating layer 54. The contact hole CH10, the contact hole CH11 and the contact hole CH12 penetrate the insulating layer 54.

The first portion 11 and the third portion 13 can be formed, for example, of a metal material or a transparent conductive material, and may be of a single-layer or a stacked-layer structure. The second portion 12 and the connecting wiring line WR are made of any of the metal materials mentioned above or an alloy of any combination of these metal materials, and may be of a single-layer or stacked-layer structure.

Figure 8:
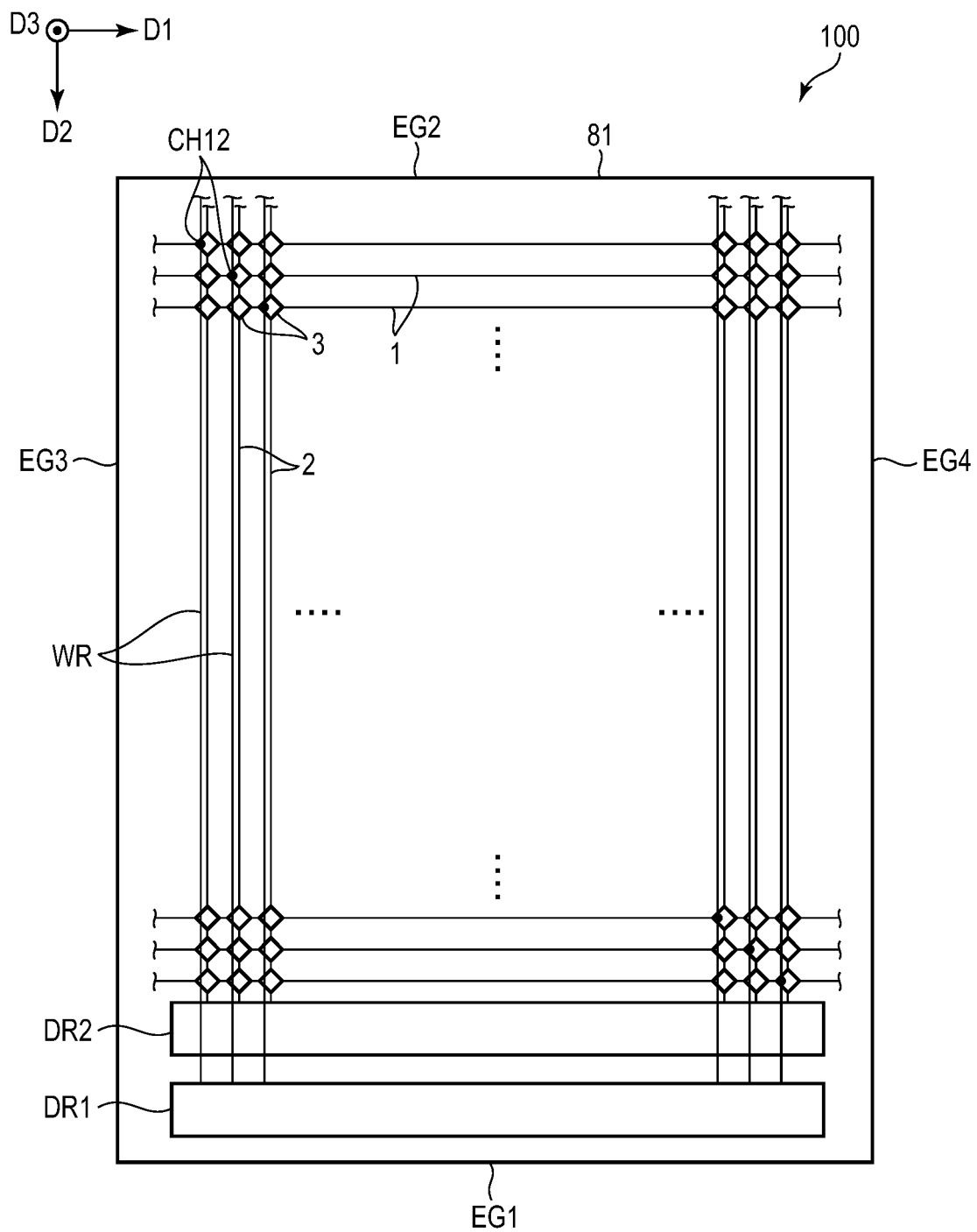
FIG. 8 is a plan view showing a modified example of this embodiment.

FIG. 8 is a plan view of a modified example of this embodiment. The configuration shown in FIG. 8 is different from that of FIG. 1 in that the positions of the scanning line driver DR1 and the signal line driver DR2 are switched.

The scanning line driver DR1 is located between the signal line driver DR2 and the first side edge E G1. A plurality of connection wiring lines WR pass through the area where the signal line driver DR2 is located.

In such a modified example as well, advantageous effect similar to those described above can be obtained.

As described above, according to the embodiment, it is possible to obtain a flexible substrate with improved elasticity.

Note that this embodiment is described in connection with the case where the electric element 3 is an OPD, but the electric element 3 may be a sensor other than OPD. Further, the upper electrode EL2 may not be of a rectangular shape, or may be placed on the entire surface of the flexible substrate 100. In that case, as the material of the upper electrode EL2, not ITO or IZO, but an electrode material having elasticity can be used. Or, the upper electrode EL2 may be formed into a pattern similar to that of the insulating base 4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
    an insulating base including a plurality of first strip portions extending along a first direction and aligned along a second direction intersecting the first direction, and a plurality of second strip portions extending along the second direction and aligned along the first direction and a plurality of island-shaped portions located at respective intersections of the first strip portions and the second strip portions;
    a plurality of electrical elements overlapping the island-shaped portions, respectively;
    a plurality of scanning lines each extending while overlapping the respective first strip portion;
    a plurality of signal lines each extending while overlapping the respective second strip portion;
    a plurality of connection wiring lines each extending while overlapping the respective second strip portion and the respective signal line;
    a scanning line driver to which the connection wiring lines are connected;
    a signal line driver to which the signal lines are connected;
    a support body supporting the insulating base, the scanning line driver and the signal line driver and including a first side edge, wherein
    multiple scanning lines are connected to different connection wiring lines on different island-shaped portion, respectively, and
    the scanning line driver and the signal line driver are located on a side of the first side edge.

2. The flexible substrate of claim 1, wherein
    the scanning lines each include a first portion, a second portion connected to the first portion via a first contact hole and a third portion connected to the second portion via a second contact hole,
    the first portion and the third portion overlap the first strip portion, the second portion is located between the first portion and the third portion in plan view, and overlaps the respective island-shaped portion, the respective connection wiring line is connected via a third contact hole to the third portion extending to the island-shaped portion at a position overlapping the island-shaped portion, and the third contact hole, the second contact hole, and the first contact hole are aligned along the first direction in this order.

3. The flexible substrate of claim 2, further comprising a first insulating layer and a second insulating layer, stacked one on another, wherein the connection wiring line and the second portion are located between the first insulating layer and the second insulating layer, the first portion and the third portion are located on the second insulating layer, and the first contact hole, the second contact hole, and the third contact hole penetrate the second insulating layer.

4. The flexible substrate of claim 1, wherein the signal line driver is located between the scanning line driver and the first side edge, and multiple signal lines pass through an area where the scanning line driver is located.

5. The flexible substrate of claim 1, wherein the scanning line driver is located between the signal line driver and the first side edge, and multiple connection wiring lines pass through an area where the signal line driver is located.

* * * * *